United States Patent [19]

Kitaguchi et al.

[11] Patent Number: 4,879,466
[45] Date of Patent: Nov. 7, 1989

[54] SEMICONDUCTOR RADIATION DETECTOR

[75] Inventors: Hiroshi Kitaguchi, Ibaraki; Shigeru Izumi, Tokyo; Satoshi Suzuki, Mito, all of Japan

[73] Assignee: Hitachi, Ltd., Tokyo, Japan

[21] Appl. No.: 150,205

[22] Filed: Jan. 29, 1988

[30] Foreign Application Priority Data

Feb. 6, 1987 [JP] Japan ................................ 62-24563

[51] Int. Cl.⁴ .......................... G01T 1/24; H01L 27/14
[52] U.S. Cl. .................................. 250/370.14; 357/29
[58] Field of Search ............ 250/370, 370.14, 370.12, 250/370.06, 370.07; 357/29, 52

[56] References Cited

U.S. PATENT DOCUMENTS 4,163,240  7/1979  Swinehart et al. .................. 357/30

FOREIGN PATENT DOCUMENTS

| | | | |
|---|---|---|---|
| 56-157070 | 12/1981 | Japan | 357/29 |
| 59-13383 | 1/1984 | Japan | 357/29 |
| 59-55075 | 3/1984 | Japan | 357/29 |
| 59-108367 | 6/1984 | Japan | 357/29 |
| 59-145579 | 8/1984 | Japan | 357/29 |
| 61-74375 | 4/1986 | Japan | 357/29 |

Primary Examiner—Janice A. Howell
Assistant Examiner—Richard Hanig
Attorney, Agent, or Firm—Antonelli, Terry & Wands

[57] ABSTRACT

A structure of semiconductor radiation detector element having a p-n junction comprises a substrate layer including a radiation absorbing layer having a silicon equivalent thickness not smaller than 140 μm and located adjacent to a depletion layer formed at the p-n junction. With the simplified structure, both the detection sensitivity and the energy compensating performance are enhanced significantly.

13 Claims, 5 Drawing Sheets

SEMICONDUCTOR RADIATION DETECTOR

BACKGROUND OF THE INVENTION

The present invention relates generally to a semiconductor radiation detector operable in room temperature range and with a low supplying voltage for detecting radioactive rays (hereinafter also referred to as radiation). In particular, the present invention relates to an improved structure of a semiconductor radiation detector which is significantly enhanced in respect to the detection sensitivity and the capability of maintaining a constant sensitivity independent of variations in energy level of the incident radiation (hereinafter also referred to as the energy compensating capability).

There is a known semiconductor radiation detector having a structure in which a layer of a fluorescent material is deposited on a detector element, and wherein light emitted by the fluorescent layer in response to impingement of the radiation is guided to a depletion layer formed internally of the semi-conductor detector element, thereby assuring an enhanced or increased detection sensitivity for the radiation of low energy level (lower than 10 KeV), as is disclosed in Japanese Patent Application Laid-Open No. 55075/1984 (JP-A-59-55075).

Usually, the range of energy to be measured by the ordinary radiation monitors and dosimeters or dosemeters is of 80 KeV to 3 MeV, as recommended in Japanese Industrial Standards (JIS) Z4324 P450. Accordingly, with the range of energy envisaged by the radiation detector disclosed in the above cited publication, use of the radiation detector is apparently restricted to a specific application. Further, endeavours made heretofore in an effort to increase the detection sensitivity per unit area of the semiconductor radiation detector are almost exclusively concerned with how to increase the thickness of a depletion layer formed in the radiation sensitive portion, as is described in Japanese Patent Application Laid-Open No. 108367/1984 (JP-A-59-108367). In this connection, it is known that the thickness of the depletion layer as formed is proportional to the $\frac{1}{2}$-th power of the voltage supplied to the semiconductor detection element. As is also disclosed in the publication mentioned just above, that sensitivity of the radiation detector element can be changed by varying the voltages supplied to a main electrode and an annular control electrode. Thus, the known arrangement is based on the concept of varying the sensitivity of the radiation detector element by resorting exclusively to the factors external of the detector element, which is equivalent to the employment of two detector elements for the purpose of doubling the sensitivity.

As will be understood from the above, approaches for increasing the detection sensitivity in the hitherto known semiconductor radiation detectors rely on the external means such as the provision of the fluorescent film, control of the supplied voltage and so forth.

On the other hand, Japanese Patent Application Laid-Open No. 74375/1987 (JP-A-61-74375) discloses a structure of the semiconductor radiation detector in which a p-n junction is formed in such a pattern that a depletion layer makes appearance in a radial configuration having a plurality of elongated regions extending radially, and which is also provided with a region extending around the depletion layer on a semiconductor substrate surface, the region having a width corresponding to the range of the secondary electrons produced by the incident gamma rays having the maximum energy level of those to be detected, wherein the secondary electrons produced by the gamma rays impinging on the region enhance the energy compensating capability.

Of the known techniques described above, the semiconductor radiation detector of the structure in which the fluorescent film is deposited presents a problem from the stand point of practical application that the range of energy to be measured by the ordinary radiation monitor and the dosimeter or dosemeter (as recommended by JIS) is not taken into consideration in the use of the radiation detector. On the other hand, the semiconductor radiation detector in which the applied voltage is changed suffers a disadvantage that the exposure dose rate can not be determined with acceptable accuracy because no consideration is paid to the fact that the energy compensating capability (i.e. the capability of maintaining the detection sensitivity to be constant independent of energy level of the gamma rays incident on the detector) will change when the thickness of the depletion layer varies. Certainly, the last mentioned prior art is concerned with the improvement or enhancement of the energy compensating capability. However, since no attention is paid to a leakage current flowing through the semi-conductor substrate, it is expected that some kind of problem will arise in the practical application, as well as because of the absence of the means for increasing the detection sensitivity of the radiation detector.

SUMMARY OF THE INVENTION

Accordingly, it is an object of the present invention to provide a semiconductor radiation detector which requires neither external means (such as control of externally supplied voltage) nor introducing additional material (such as deposition of the fluorescent layer) and which can operate on the simplest principle while assuring a high detection sensitivity as well as an enhanced energy compensating capability over a range of energy expected in practical applications.

In view of the above and other objects which will be more apparent as description proceeds, it is a general aspect of the invention that a substrate layer of a thickness greater than a predetermined value is provided adjacent to a depletion layer formed at a p-n junction. With this simple arrangement, it has been found surprisingly that there can be accomplished significant improvement of both the detection sensitivity and the energy compensating capability of the semiconductor radiation detector.

DESCRIPTION OF THE PREFERRED EMBODIMENTS

Operation of a p-n junction type semiconductor radiation detector element is based on utilization of such phenomenon that incident radiation (gamma rays) undergoes interaction such as Compton scattering or the like with the semiconductor material, resulting in emission of secondary electrons, which in turn produce charge carriers such as electrons and positive holes within a depletion layer to provide a radiation detection signal. In order to enhance the sensitivity of the radiation detector element, two important factors must be considered. They are: (1) increase of the number of electron/hole pairs produced in the depletion layer, and (2) decrease of the leakage current in the radiation detector element for improving the S/N ratio associated with collection of the electron/hole pairs.

Concerning the energy compensating capability which constitutes another subject matter envisaged by the present invention, it is noted that the rate at which the interaction taking place between the semiconductor material and the incident radiation varies considerably as a function of the energy level of the latter. More specifically, in case the incident radiation is at a low energy level (e.g. lower than 300 KeV), the amount of radiation absorbed by the depletion layer is sufficiently large to assure a high sensitivity even when the thickness of the depletion layer is small. On the other hand, in case the incident radiation is at a high energy level (e.g. higher than about 300 KeV), the amount of absorption of the radiation in the depletion layer is reduced, whereby the sensitivity of the radiation detector element is correspondingly lowered. Accordingly, in order to enhance the energy compensating capability, it is important to provide some measures for increasing the sensitivity even in the case where the incident radiation energy is high. With the present invention, it is contemplated to solve these problems.

In light of the above, there is proposed by the present invention a structure of a semi-conductor radiation detector element in which a substrate layer having at least a predetermined radiation absorbing layer is provided adjacent to a depletion layer formed at the p-n junction. In the hitherto known process of manufacturing the p-n junction type detector element, it has been a general practice to adopt the IC manufacturing process as it is, which is characterized by a tendency of fabricating ICs in more and more thin and small size and light weight. Further, the semiconductor element can serve in principle as the radiation detector so far as the element has a thickness enough to be capable of forming and sustaining the depletion layer of 50 to 150 $\mu$m in thickness. For these reasons, no consideration has heretofore been paid to the provision of a surplus substrate layer. Parenthetically, the radiation detector elements manufactured by the known process are commonly of a thickness not greater than 400 $\mu$m.

In contrast, in the semiconductor radiation detector element of the structure taught by the invention, secondary electrons produced within the bulk of substrate through interaction with the incident radiation can reach the depletion layer in dependence on the range of the secondary electrons which in turn depends on the energy level of the incident radiation. This provides a first factor which contributes to the enhancement of the detection sensitivity. On the other hand, the leakage current can be reduced by increasing the thickness of the substrate layer because impurities of the p-n junction then tend to be captured by the substrate layer, whereby the depletion layer of high purity is formed to allow the leakage current to be decreased. The increasing in thickness of the substrate layer can be easily accomplished in manufacturing the detector element through a diffusion process at the temperature of about 1100° C. In conjunction with the energy compensating capability, it should be mentioned that the range of the secondary electron is increased as the energy level thereof is higher and hence the ratio at which the secondary electrons produced in the substrate layer can reach the depletion layer is also increased correspondingly. This in turn means that the sensitivity of the radiation detector element is increased in proportion to the energy level of the incident radiation rays, whereby the energy compensating capability can be ensured.

As will be appreciated, the provision of the substrate layer of a thickness greater than a predetermined value is very effective in realizing the performance and capability required indispensably for the semi-conductor dosimeter or dosemeter.

The invention will now be described in detail in conjunction with the preferred and exemplary embodiments thereof by reference to the accompanying drawings, in which like parts or elements are denoted by like reference symbols throughout the several figures.

Figure 1:
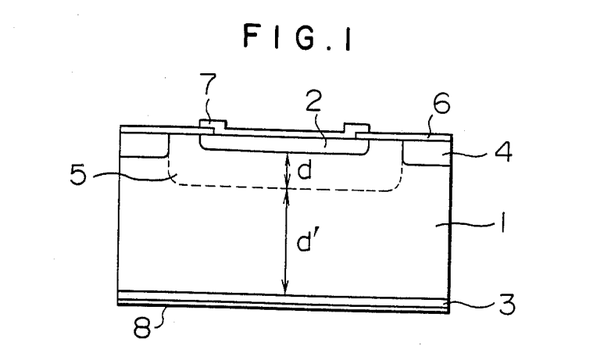
FIG. 1 is a view showing in section a semi-conductor radiation detector element according to an exemplary embodiment of the present invention.
Figure 2:
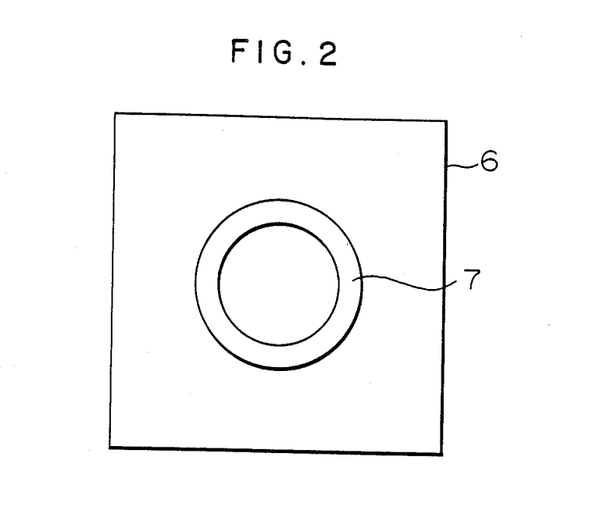
FIG. 2 is a top plan view of the detector element shown in FIG. 1.

FIG. 1 shows in a sectional view a structure of the semiconductor radiation detector element according to an embodiment of the invention and FIG. 2 is a top plan view of the same. The structure of semiconductor radiation detector element made of a high purity semi-conductor material (having a specific resistance greater than 1 K$\Omega$cm) such as silicon or the like includes a n$^+$-layer 2 formed in a silicon substrate 1 through diffusion of phosphor (P), a p$^+$-layer 3 and a p$^+$-channel stopper 4 formed in the substrate 1 through diffusion of boron (B), wherein a depletion layer 5 is formed at a p-n junction between the n$^+$-layer 2 and the p-type silicon substrate 1. A silicon oxide film 6 is formed over the n$^+$-layer 2 and subsequently photo-etched partially to allow a signal lead-out electrode 7 (e.g. of aluminum or the like) to be provided. Further, an electrode 8 is provided in ohmic contact with the p+-layer 3. When a voltage is applied across the electrodes 7 and 8 in such polarity such that a positive or plus potential makes appearance at the n+-layer 2 with the negative or minus potential appearing at the p+-layer 3, the depletion layer 5 at the p-n junction spreads toward the channel stopper 4 and the substrate 1. However, because the channel stopper 4 is of a p+-layer, spreading of the depletion layer 5 in the plane direction is limited by the channel stopper 4. The depth d of the spread in the substrate 1 can be approximated by $$d = 0.3 \sqrt{\rho \cdot V}$$

where V represents the supplied voltage and p represents the specific resistance of the semiconductor material.

Although the above mentioned structure of the radiation detector is implemented by using a p-type silicon substrate, it will be readily understood that a similar structure can equally be realized by employing a n-type silicon substrate. Here, description will be made briefly on the principle of operation of the semi-conductor radiation detector element. Incident radiation (gamma rays) brings about interaction such as Compton scattering or the like with the semiconductor material, resulting in the generation of secondary electrons within the bulk of semiconductor material. These secondary electrons in turn give rise to generation of charge carriers or electron/hole pairs, whereby the resulting current of very small magnitude is collected through the electrodes 7 and 8 to form a detection signal representative of the incident radiation.

Figure 3:
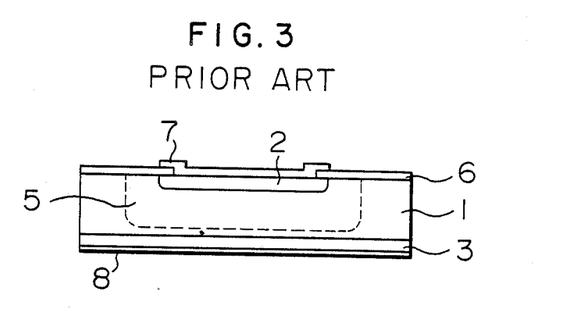
FIG. 3 is a view showing a structure of a semiconductor radiation detector element known heretofore.

FIG. 3 shows a structure of a hitherto known semiconductor radiation detector element, as exemplified by the one disclosed in No. JP-A-56-157070. Referring to this figure, the structure consisting of the n+-layer 2, the p+-layer 3, the electrodes 7 and 8 and the silicon oxide film 6 is essentially identical with that of the radiation detector according to the embodiment of the invention shown in FIG. 1. Spreading of the depletion layer 5 will take place similarly to the case of the inventive radiation detector element so far as the supplied voltage V and the specific resistance ρ are same. It should however be noted that no consideration is paid to the thickness of the substrate layer at all in the case of the known structure of the radiation detector shown in FIG. 3. In contrast, it is important to note that in the case of the inventive radiation detector element shown in FIG. 1, the thickness of the substrate layer 1 is selected to be greater than 140 μm. The thickness d of the depletion layer 5 is about 70 μm when the specific resistance is 2 KΩcm with the applied voltage being 30 V. In case the applied voltage is 100 V, the thickness d of the depletion layer will be 120 μm. On the other hand, the inner diameter of the channel stopper 4 may remain substantially constant, for example, at several millimeters. The semiconductor radiation detector element for practical application will be of a planar configuration having an overall thickness of several hundred microns.

Next, description will be turned to the effectiveness of the inventive detector structure in realizing the high detection sensitivity and the energy compensating capability which are indispensably required for the semiconductor detector element intended to be used as the dosimeter or dosemeter.

Figure 4:
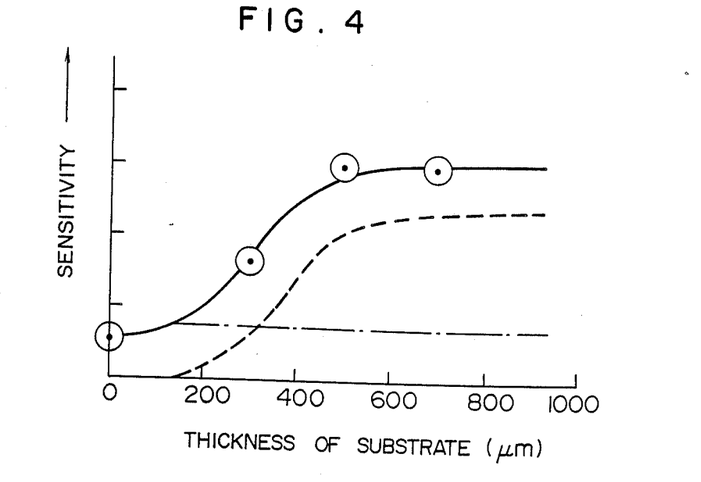
FIG. 4 is a view for illustrating graphically a relation between the thickness of a substrate layer and the detection sensitivity.

The secondary electrons produced within the depletion layer 5 directly give birth to electron/hole pairs. As a consequence, when the incident gamma rays are at a low energy level, the ratio at which the gamma rays are absorbed by the depletion layer 5 is high, ensuring thus a high detection sensitivity. As the energy level of the incident gamma rays is increased, the ratio at which the gamma rays can go through and out of the depletion layer 5 without being absorbed therein will increase correspondingly. Thus, in the case of the semiconductor detector element according to the invention in which the substrate layer 1 is provided adjacent to the depletion layer 5, the secondary electrons are produced within the substrate 1. The secondary electrons thus produced travel isotropically within the bulk of semiconductor material, and a part of the secondary electrons reach the depletion layer 5, giving birth to the electron/hole pairs. Besides, the radiation incident on the substrate layer 1 is also effective to give birth to the electron/hole pairs. The electron/hole pair has a predetermined diffusion length $L_n$ given by $$L_n = \sqrt{D_n \cdot \tau_n}$$

where $D_n$ represents the diffusion coefficient of electron and $\tau_n$ represents the lifetime of electron. Thus, a part of electrons can directly reach the depletion layer 5 through diffusion. In this manner, secondary electrons originating in two different layers (i.e. the depletion layer 5 and the substrate layer 1) play roles in giving birth to the electron/hole pairs. Since the semiconductor detector element according to the invention is generally of a planar configuration (i.e. flat plate-like configuration) as described hereinbefore, it is expected that the secondary electrons traveling into the planar depletion layer 5 from the underlying substrate layer 1 can provide a great contribution to the generation of the electron/hole pairs. FIG. 4 illustrates graphically a relationship between the thickness of the substrate layer 1 and the sensitivity of the detector element. In FIG. 4, a solid line curve represents the detection sensitivity measured actually, a single-dot line represents the contribution of the secondary electrons originating in the depletion layer 5 to the actually measured sensitivity, and a broken line curve represents the contribution of the secondary electrons originating in the substrate layer 1 to the measured sensitivity. It has been found that when compared with the conventional radiation detector element in which the substrate layer thickness is less than 140 μm, the radiation detector element incorporating the substrate layer of a greater thickness as taught by the invention exhibits the radiation detection sensitivity of at least four times as high as that of the conventional radiation detector.

Figure 5:
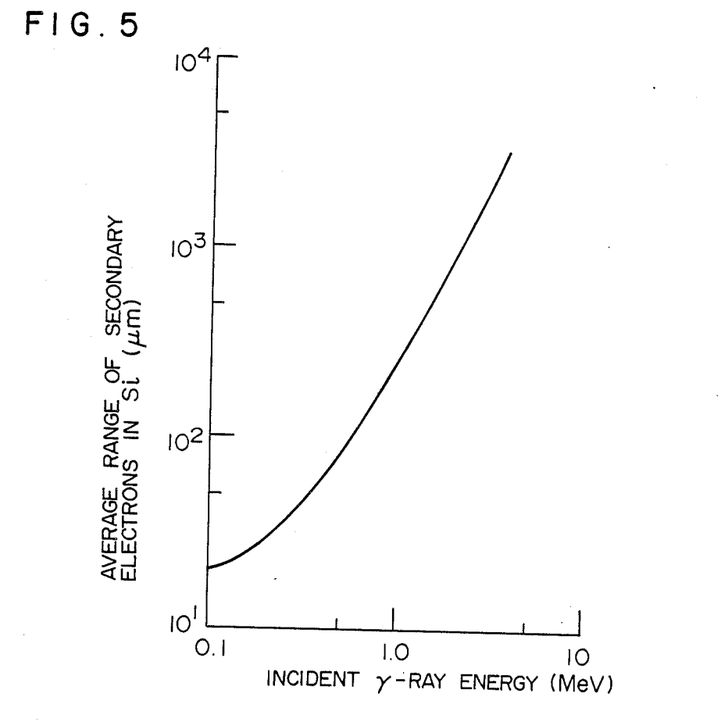
FIG. 5 is a view for graphically illustrating a relation between incident gamma ray energy and the average range of the secondary electrons produced in the bulk of silicon.

FIG. 5 illustrates graphically a relationship between the energy level of the incident gamma rays and the average range of the secondary electrons in the silicon substrate. As will be seen in this figure, the range of 140 μm corresponds to the incident gamma ray energy of at least 600 to 700 KeV, which shows that the inventive detector element intended for use as the dosimeter or dosemeter is equally effective for the measurement of radiation of high energy levels in the range of 80 KeV to 3 MeV required for the dosimeter or dosemeter.

Figure 6:
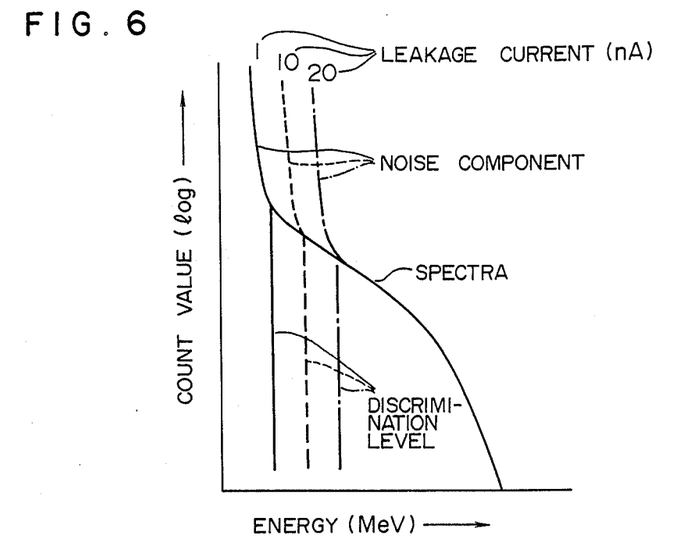
FIG. 6 is a view for illustrating graphically a distribution of pulse height (energy spectra) of the detection signals obtained in a radiation measurement.

Next, reduction in the leakage current will be discussed. The leakage current can be roughly classified into a current component flowing in the surface of the detector element and a current component flowing through the bulk of the semiconductor material. FIG. 6 shows typical distributions of crest or peak values of the detection signals resulting from actual measurements of radioactive rays for the leakage currents of 1 nA, 10 nA and 20 nA, respectively. The leakage current of the detector directly contributes to generation of noise component in the detection signal. In order to measure the radiation with accuracy, it is necessary to discriminate the intrinsic detection signal from the noise component. To this end, a discriminator is generally employed. In this conjunction, it will also be seen from FIG. 6 that the threshold level of the discriminator can be set lower as the noise component and hence the leakage current is smaller, whereby a net value to be counted can be made greater.

Figure 7:
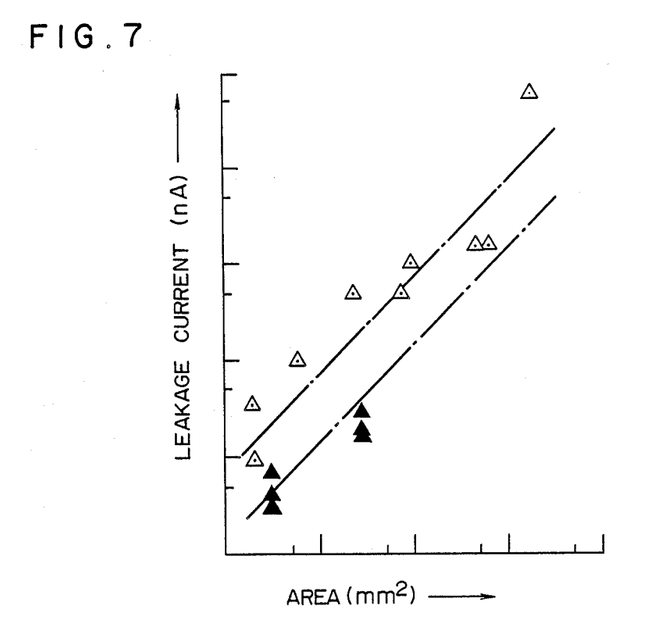
FIG. 7 is a view for illustrating graphically the results of comparison made between the leakage current in a radiation detector implemented according to the invention and that of a radiation detector known heretofore.

The leakage current $I_d$ flowing through the bulk of the semiconductor detector element is given by:

$$I_d = \frac{1}{2} \cdot \frac{q \cdot n_i \cdot d \cdot s}{\tau}$$

where q represents the charge of electron, $n_i$ represents carrier concentration in an intrinsic semiconductor, d represents the thickness of the depletion layer, s represents junction area of the detector element, and $\tau$ represents the lifetime of the carrier. As will be seen from the above expression, reduction in the leakage current definitely depends on the lifetime $\tau$ of the carrier for a given detector structure and a given semiconductor material. In other words, by prolonging the carrier lifetime $\tau$, the leakage current can be correspondingly decreased. FIG. 7 graphically illustrates the results of comparison of the leakage current in the inventive radiation detectors and that of conventional radiation detectors. More specifically, solid triangular marks represent the data obtained in the detector elements of the structure taught by the invention, while blank triangular marks represent the data obtained from the conventional detectors. The results of actual measurements of the carrier lifetime in both the inventive detectors and the conventional detectors show that the lifetime of the carrier in the inventive detector is five to ten times as long as that of the carrier in the conventional detector. This means that there can be realized a radiation detector element of high performance in which the leakage current is decreased to about a tenth part of that of the conventional detector. Such reduction in the leakage current can be explained by the fact that impurities existing at the p-n junction are captured by the substrate upon implementing the detector element through a high-temperature diffusion process at a temperature of about 1100° C. When the impurity concentration in the depletion layer at the p-n junction is lowered, charges (carriers) produced upon impingement of radiation are unlikely to be captured by the impurities, whereby the lifetime of the carriers is necessarily prolonged.

The leakage current component flowing in the surface of the detecting element is determinatively influenced by the surface treatment and the mount structure of the surface electrode. In particular, a $SiO_2$-film used as a passivation layer for protecting the surface of silicon substrate is likely to form an inversion layer in cooperation with silicon. This inversion layer provides a major cause for the surface leakage current. Under the circumstance, in the case of the radiation detector element shown in FIG. 1, the channel stopper 4 is provided for the purpose of preventing the surface leakage current, wherein the channel stopper 4 is realized by forming a $p^+$-layer in the surface of the substrate 1 on the $n^+$-electrode side of the p-n junction, in such a manner that the $p^+$-layer surrounds the $n^+$-layer 2 without contacting the $n^+$-layer 2 (by diffusing boron as the impurity). The width of the channel stopper should preferably be about 0.2 to 2 mm. In this way, the surface leakage current can be prevented by providing the $p^+$-layer in the semiconductor radiation detector element to thereby form the channel stopper 4, whereby there can be realized a high sensitive detector element enjoying an improved S/N ratio. Unless the surface leakage current can be prevented, S/N ratio will be deteriorated and detection sensitivity will be lowered. Thus, it is necessary to prevent positively the surface leakage current for inhibiting these adverse effects from taking place.

Figure 8:
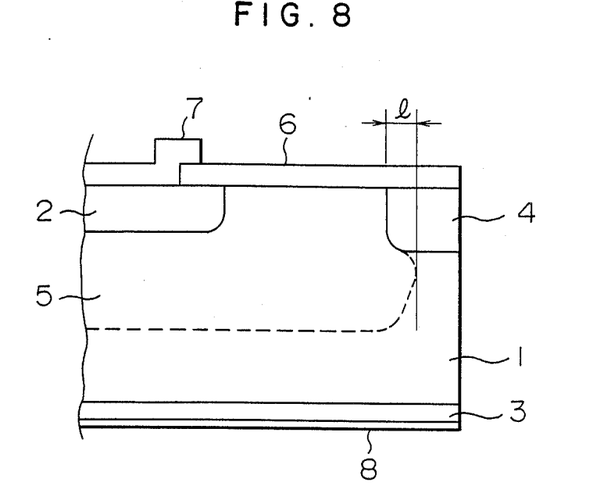
FIG. 8 is a view showing in an enlarged vertical section a portion of the detector element including a channel stopper.

The structure of the channel stopper 4 will now be described in more detail. FIG. 8 is a partially enlarged view showing more clearly a structure of the channel stopper 4. As will be seen, the depletion layer 5 spreads into the bulk of the silicon substrate, lying partially below the channel stopper 4. What is important is the spread of the depletion layer 5 underneath the channel stopper. It should be noted that when the spread or extent of the depletion layer 5 underneath the channel stopper 4 is longer than a certain length indicated by l in FIG. 8, the function of the channel stopper 4 to prevent the leakage current can no more be assured.

Figure 9:
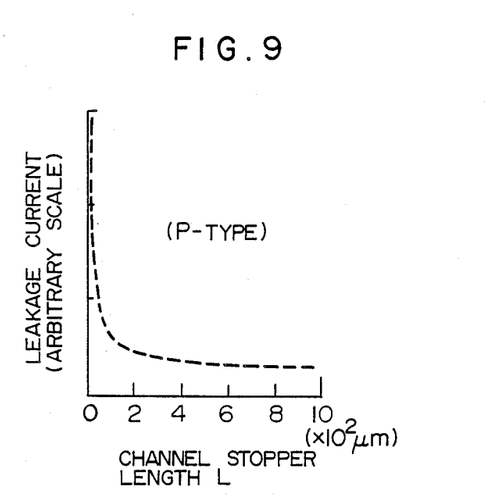
FIG. 9 is a view for illustrating graphically a relation between the length of the channel stopper and the leakage current.

FIG. 9 illustrates graphically the experimentally obtained data concerning the relation between the length of the channel stopper 4 as measured from one end of the silicon substrate and the leakage current. As will be seen from this figure, the leakage current increases steeply, starting from the length L of about 200 μm. In other words, the dimension l shown in FIG. 8 substantially corresponds to this length of about 200 pm. Further, the length l bears a close relationship to the specific resistance $\rho$ of the silicon substrate and the supplied bias voltage V, as indicated by the following experimentally derived expression:

$$l = (V/V_c)^{1/3} \cdot (\rho/\rho_c)^{1/2} \cdot a$$

where $V_c$ represents a proportional constant of the supplied bias voltage, $\rho_c$ represents a proportional constant of the specific resistance, and $a$ is a constant determined by the type (p- or n-type) of the silicon substrate.

Figure 10:
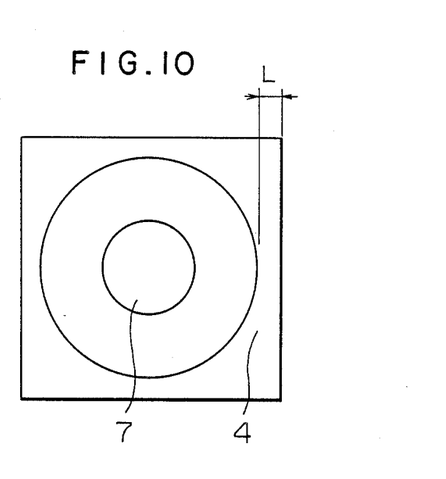
FIG. 10 is a top plan view of a radiation detector element according to the present invention.

Determining the value of the critical length l in the semiconductor radiation detector according to the present invention in accordance with the above expression on the assumption that the silicon substrate is of p-type, V=50 volts and that ρ32 20 KΩcm, it is found that l=115 μm, and when the substrate is of n-type, l=192 μm. Parenthetically, the specific resistance $\rho$ of 250 KΩcm defines the upper limit in the application for which the semiconductor detector element is intended. When the supplied bias V is 100 volts, the critical length l is 160 μm in case the silicon substrate is of p-type, while for the n-type silicon substrate, the length l of concern is 270 μm. For the practical purposes, the length l should preferably be selected about twice as long as the experimentally obtained value by consulting the data illustrated in FIG. 9. A top plan view of the detector element is shown in FIG. 10. It is found that in the case of the detector element of a square configuration such as shown in FIG. 10, the length L which the channel stopper should assume actually becomes shortest.

Of course, the length L could be very long, which however means that the silicon substrate is used wastefully and undesirable from the economical standpoint, since the size of the element exerts direct influence to the number of the elements which can be cut from a single sheet of wafer and hence to the manufacturing cost per element.

In light of the above, the length L of the channel stopper should preferably be in the range of 0.2 to 2 mm, as mentioned above.

Next, discussion will be turned to the energy compensating capability of the radiation detector element. In the dosimeter or dosemeter, it is required to reduce nonuniformity in the sensitivity (CPS/mR.h$^{-1}$) to a possible minimum in the range of energy of the gamma rays to be measured.

Figure 11:
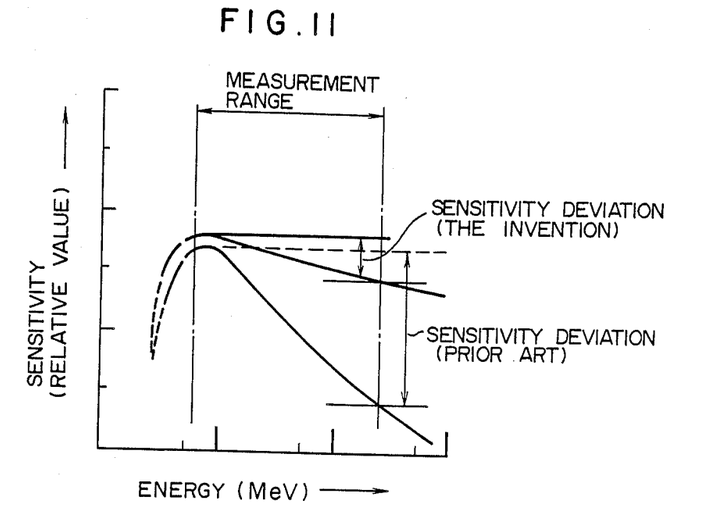
FIG. 11 is a view for illustrating graphically the energy compensating capability of the radiation detector element according to the present invention in comparison with that of a conventional radiation detector element.

FIG. 11 illustrates graphically typical relations between the sensitivity and the energy level in the radiation detector element according to the invention (shown in FIG. 1) in comparison with that of a conventional detector element. As will be seen in this figure, deviation in the sensitivity of the detector element according to the invention (shown in FIG. 1) can be suppressed within ±33%, while ±100% of sensitivity deviation is present for the conventional detector element. More specifically, the sensitivity $D_s$ (=CPS/mR.h$^{-1}$) of the dosimeter or dosemeter is generally given by the following expression:

$$D_S \alpha \frac{W_{air}}{0.387} \cdot \frac{\mu(Si) \cdot d}{E}$$

where $W_{air}$ represents an amount of energy required for producing one ion pair in the air, $\mu(Si)$ represents a gamma ray absorption coefficient, d represents the thickness of the depletion layer and E represents the energy level of the incident radiation. As described hereinbefore, in the case of the detector element according to the invention, a thick substrate layer 1 is provided adjacent to the depletion layer 5 to such effect that the thickness of the depletion layer in appearance is increased in proportion to the energy level of the incident gamma rays (and hence the range of secondary electrons). When the increase in the apparent thickness of the depletion layer due to the range of secondary electron is represented by d'(E), the above expression can be rewritten as follows:

$$D_S \alpha \frac{W_{air}}{0.387} \cdot \frac{\mu(Si) \{d + d'(E)\}}{E}$$

As the factor d'(E) increases in dependence on the energy level of the incident gamma rays, the relation between the sensitivity Ds and energy of the incident gamma rays is correspondingly flattened, which is the primary cause for significant enhancement of the energy compensating capability of the substrate layer 1.

As will be appreciated from the foregoing description, there can be realized a semiconductor radiation detector element suited optimally for dosimeter or dosemeter according to the teachings of the invention. The inventive detector element can be used for numerous radiation detecting applications such as various type radiation monitors and survey meters as well as personal exposure dosemeter in nuclear power plants and other fields.

Although the foregoing description has been made on the assumption that the detector element is of p-n junction type, it is apparent that the concept of the invention can be adopted in various types of semi-conductor radiation detector elements such as surface barrier type detector and others. In these modifications, the thickness of the substrate layer may be selected on the basis of a criterion that the substrate layer has a thickness equivalent to 140 μm or more thick of the silicon substrate (referred to as the silicon equivalent thickness), as taught herein. When a semi-conductor material such as, for example, Cd.Te is employed, the linear absorption coefficient μ(Cd.Te) determined from the mass absorption coefficient and the density of Cd.Te and the degree of radiation absorption $\{e^{-\mu(Cd.Te)}\}$ determined by the thickness d' thereof are so selected as to be equivalent to those of 140 μm or more thick silicon substrate. Namely, $$e^{-\mu(Cd.Te)d'(Cd.Te)} \geq e^{-\mu(Si) \cdot d'(Si)}$$

where $\mu(Si)$ represents the linear absorption coefficient of silicon, and d'(Si) represents the thickness of 140 μm and $\mu(Cd.Te)$ represents the linear absorption coefficient of Cd.Te and d'(Cd.Te) represents the thickness of the Cd.Te substrate.

The optimal upper limit imposed on the thickness of the substrate layer is considered to lie in the range of 600 to 800 μm in view of the experimentally obtained results illustrated in FIG. 4. The thickness in this range coincides with the average range of the secondary electrons of several MeV, as will be seen in FIG. 5, which represents the upper limit of the range of energy to be measured stipulated in JIS. Thus, it can be said that the thickness of the substrate within the range mentioned above is optimal for the detection of incident radiation of the energy level up to several MeV.

Figure 12:
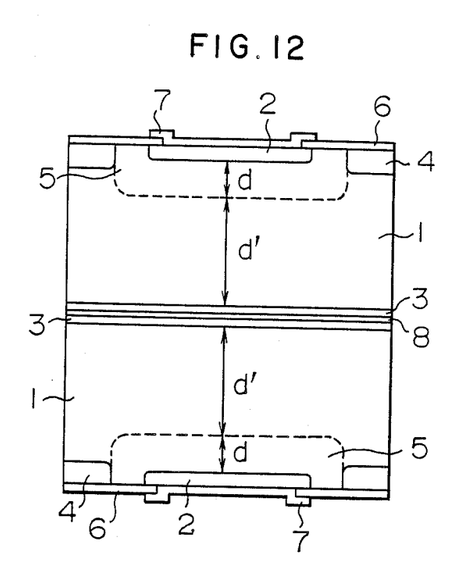
FIG. 12 is a view showing a semiconductor radiation detector of a stacked or laminated structure having a common electrode according to another embodiment of the invention.
Figure 13:
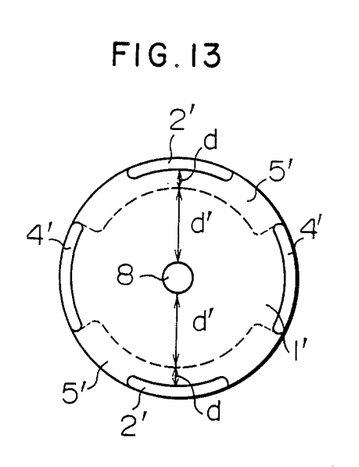
FIG. 13 is a view showing a semiconductor radiation detector of a spherical configuration according to a still further embodiment of the present invention.

FIG. 12 shows a detector structure according to another embodiment of the invention in which two detector elements each of the structure described in the foregoing are stacked together with one electrode 8 being used in common to both elements. With this stacked or laminated detector structure, the radiation detecting sensitivity can be further increased. Important also in this detector structure is the provision of the substrate layer 1 having a thickness of more than 140 μm as measured from the boundary with the depletion layer 5:

FIG. 13 shows a spherical detector element to which the present invention is applied. In this figure, the electrode provided on the top surface of the n$^+$-layer 2 and the oxide film are omitted from illustration. The electrode 8 disposed internally of the spherical detector element is led outwardly under maintenance of electrical insulation. In the case of this spherical detector, the substrate layer 1 having a thickness d' of at least 140 μm is provided beneath the depletion layer 5' of a thickness d. The channel stopper is denoted by a symbol 4'. With this spherical detector structure, there can be realized a non-directional semiconductor radiation detector element of extremely high performance.

Although it has been described that the p-type silicon substrate is employed, it goes without saying that the n-type silicon substrate can be equally used.

As will now be appreciated, it is possible according to the invention to manufacture a radiation detector (dosimeter or dosemeter) element having a radiation detection sensitivity (per unit area) enhanced four times or more when compared with that of the conventional detector element through the utterly same manufacturing process as the latter. Further the energy compensating capability of the detector element required indispensably for the radiation detector (dosimeter or dosemeter) can be enhanced three times or more according to the invention when compared with that of the hitherto known detector such that the sensitivity deviation can be suppressed within ±33% for ±100% of the sensitivity deviation of the conventional detector element at the radiation energy level in the range of 80 KeV to 3 MeV. These performance and capability are indispensable for the semiconductor radiation detector elements. Further, the teachings of the invention can be adopted in various types of semi-conductor radiation detector elements to the substantially same advantageous effects.

We claim:

1. A semiconductor radiation detector, comprising:
 a p-n junction;
 a substrate layer provided adjacent to a depletion layer formed at said p-n junction and having a radiation absorbing layer of a silicon equivalent thickness not smaller than 140 μm; and
 a channel stopper provided in the surface of said substrate layer and surrounding said p-n junction, to prevent said depletion layer from spreading along the surface of said substrate layer.

2. A semiconductor radiation detector according to claim 1, wherein said substrate layer includes silicon.

3. A semiconductor radiation detector according to claim 1, wherein said radiation absorbing layer has a silicon equivalent thickness in a range of 140 to 800 μm.

4. A semiconductor radiation detector according to claim 3, wherein said substrate layer includes silicon.

5. A semiconductor radiation detector according to claim 1, wherein said channel stopper surrounds said p-n junction without contacting said p-n junction.

6. A semiconductor radiation detector according to claim 5, wherein said channel stopper is at least 200 μm in width.

7. A semiconductor radiation detector, comprising:
 a first electrode;
 a pair of high resistance semiconductor regions of one conductivity type formed with said electrode being sandwiched therebetween;
 a pair of semiconductor regions of the other conductivity type each formed in each of said high resistance semiconductor regions;
 second electrodes formed, respectively, on said semiconductor regions of said other conductivity type;
 radiation absorbing regions each provided between each of depletion layers formed, respectively, at junctions between said high resistance semiconductor regions and said other conductivity type semiconductor regions, respectively, and each having a silicon equivalent thickness not smaller than 140 μm; and
 a pair of channel stoppers provided in respective surfaces of said high resistance semiconductor regions and surrounding respective junctions, to prevent said depletion layers from spreading along the surfaces of said high resistance semiconductor regions.

8. A semiconductor radiation detector according to claim 7, wherein said radiation absorbing region includes silicon.

9. A semiconductor radiation detector according to claim 7, wherein said radiation absorbing region has a silicon equivalent in a range of 140 to 800 μm.

10. A semiconductor radiation detector according to claim 7, wherein each of said pair of channel stoppers surrounds said respective junctions without contacting said respective junctions.

11. A semiconductor radiation detector according to claim 10, wherein each of said pair of channel stoppers is at least 200 μm in width.

12. A semiconductor radiation detector, comprising:
 a spherical high resistance semiconductor region of one conductivity type;
 a first electrode provided at a center portion of said spherical semiconductor region;
 at least two semiconductor regions formed in said spherical semiconductor region and each having the other conductivity type;
 second electrodes provided, respectively, on said other conductivity type semiconductor regions;
 wherein distance between said first electrode and an end of each depletion layer formed at each junction between said spherical semiconductor region and each of said other conductivity type semiconductor regions is selected equal to a silicon equivalent thickness not smaller than 140 μm for a radiation absorbing layer; and
 a channel stopper provided in the surface of said spherical semiconductor region and surrounding each of said other conductivity type semiconductor regions, to prevent each depletion layer from spreading along the surface of said spherical semiconductor region.

13. A semiconductor radiation detector, comprising:
 a high resistance semiconductor region of one conductivity type; and
 a region of the other conductivity type formed in said high resistance semiconductor region through diffusion process;
 wherein a reverse bias voltage to be applied across a junction between said high resistance semi-conductor region and said other conductivity type region upon operation of said detector is set so that a region located between an end of a depletion layer formed in said high resistance semiconductor region along said junction and an electrode provided on said high resistance semiconductor region constitutes a region including a radiation absorbing layer having a silicon equivalent thickness not smaller than 140 μm; and
 a channel stopper provided in the surface of said high resistance semiconductor region and surrounding said other conductivity type region, to prevent said depletion layer from spreading along the surface of said high resistance semiconductor region.

* * * * *